United States Patent [19]
Al-Sharif et al.

[11] Patent Number: 6,077,353
[45] Date of Patent: Jun. 20, 2000

[54] PEDESTAL INSULATOR FOR A PRE-CLEAN CHAMBER

[75] Inventors: Mohamed A. Al-Sharif; Bradley O. Stimson; Debabrata Ghosh, all of San Jose; Barney M. Cohen, Santa Clara; Kenny King-Tai Ngan, Fremont; Murali Narasimhan, San Jose, all of Calif.

[73] Assignee: Applied Materials, Inc., Santa Clara, Calif.

[21] Appl. No.: 09/088,759

[22] Filed: Jun. 2, 1998

[51] Int. Cl.⁷ ..................................................... B05C 13/02
[52] U.S. Cl. ............................... 118/500; 118/728; 269/21
[58] Field of Search ..................................... 118/728, 500; 269/21

[56] References Cited

U.S. PATENT DOCUMENTS

| | | | |
|---|---|---|---|
| 4,793,975 | 12/1988 | Draqge | 422/186.05 |
| 5,456,757 | 10/1995 | Aruga et al. | 118/728 X |
| 5,554,266 | 9/1996 | Okamoto | 204/298.1 |
| 5,573,596 | 11/1996 | Yin | 118/723 E |
| 5,698,070 | 12/1997 | Hirano et al. | 156/643.1 |
| 5,843,237 | 12/1998 | Chun | 118/728 |

FOREIGN PATENT DOCUMENTS

| | | | |
|---|---|---|---|
| 0693771A1 | 1/1996 | European Pat. Off. | H01L 21/00 |
| 0732728A2 | 9/1996 | European Pat. Off. | H01J 37/32 |
| 0732728A3 | 9/1996 | European Pat. Off. | H01J 37/32 |
| 8-78321 | 3/1996 | Japan | H01L 21/027 |
| 9-45758 | 2/1997 | Japan | H01L 21/68 |

*Primary Examiner*—Milton Cano
*Attorney, Agent, or Firm*—Thomason, Moser, and Patterson

[57] ABSTRACT

The invention generally provides an apparatus that reduces backside sputtering of the substrate in a pre-clean chamber and other etch chambers. The invention also provides an apparatus that reduces flaking of material from the film formed on the surfaces of the process kit and extends the specified lifetime of a process kit. One aspect of the invention provides an apparatus for supporting a substrate, comprising a support pedestal contacting a central portion of the substrate and an insulator surrounding the support pedestal, the insulator having a beveled portion extending from a circumferential edge of the substrate.

18 Claims, 2 Drawing Sheets

PEDESTAL INSULATOR FOR A PRE-CLEAN CHAMBER

BACKGROUND OF THE INVENTION

1. Field of the Invention

The present invention generally relates to etch chambers. More particularly, the present invention relates to an insulator for a substrate support member in an etch chamber.

2. Background of the Related Art

As integrated circuit (IC) dimensions become increasingly smaller, the need to prevent contamination by particles of the substrates on which the IC's are constructed becomes increasingly more difficult and hence, more important, because the smaller circuits can be more easily damaged by smaller particles and the new processes required to construct the smaller circuits are more susceptible to degradation by the smaller particles. Thus, the need to keep the process and related hardware components clean is becoming more important.

In order to fabricate a complete IC, typically several substrate processing systems are used, with each system performing a particular step or series of steps in the overall fabrication process. The substrates are transferred between the systems at ambient conditions. The ambient environment is maintained very clean to prevent contamination of the substrates as they are transferred between systems. The substrates may even be transferred in completely enclosed cassettes in order to further prevent contamination thereof. A problem, however, is that it is not possible to prevent the oxygen in the ambient air from forming oxides on the surfaces of the substrates. Because the oxidation of the materials in an IC can seriously alter the electrical properties of the materials, oxidized surfaces are undesirable, and the surface oxides, primarily silicon dioxide and metal oxides, need to be removed or etched from the surfaces of the substrates, in a pre-processing cleaning step, before the substrates are subjected to the primary process of the system such as physical vapor deposition and chemical vapor deposition. Particularly, substrate surface features, such as trenches, contacts or vias into which metal conductors, such as tungsten, aluminum or copper, are to be deposited need to be cleaned in order to assure a very low interface resistance between layers of deposition.

A pre-clean chamber, such as the Pre-Clean II Chamber™ available from Applied Materials, Inc., Santa Clara, Calif., cleans the substrates by removing the undesired layer of oxides. FIG. 1 is a simplified schematic view of a pre-clean chamber. Generally, the pre-clean chamber 10 has a substrate support member 12 disposed in a chamber enclosure 14 under a quartz dome 16. The substrate support member 12 typically includes a central pedestal plate 18 disposed within a recess 20 on a quartz insulator plate 22. The upper surface of the central pedestal plate 18 typically extends above the upper surface of the quartz insulator plate 22. A gap 24 of about 0.035 inches is formed between a bottom surface of the substrate 26 and the top surface 23 of the quartz insulator plate 22. During processing, the substrate 26 is placed on the central pedestal plate 18 and contained thereon by locating pin 32. The peripheral portion of the substrate 26 extends over the quartz insulator plate 22 and overhangs the upper edge of the quartz insulator plate 22. A beveled portion 28 of the quartz insulator plate 22 is disposed partially below this overhanging peripheral portion of the substrate 26, and a lower annular flat surface 30 extends from the lower outer edge of the beveled portion 28. The quartz insulator plate 22 is typically a part of a process kit that system operators periodically replace during routine maintenance. It is desirable that a process kit has a long useful lifetime, so that the downtime of the system will be a small percentage of the overall processing time.

The primary purpose of the etch cleaning is to remove oxides that form on the surface of the substrate typically when the substrate was subjected to ambient air conditions while being transported to the vacuum processing system. For a silicon substrate, most of the oxidized surface material is silicon oxide, but metal deposited on the surface of the substrate will have formed metal oxides on the surface as well. The etched material sputters off the substrate surface and forms a film on the process kit, including the exposed surfaces of the quartz insulator plate. However, it is undesirable and unnecessary to sputter material from the backside of the substrate where the substrate overhangs the insulator plate because an excess of sputtered material is generated by the backside sputtering.

As the film forms on the process kit surfaces, its density may change, resulting in stress on the film. This stress, along with differences in the coefficients of expansion of the materials in the film, can result in delamination, or flaking, of the film from the surface of the process kit. Eventually, after several hundred substrates have been cleaned, the film becomes so thick and heavy that it starts to flake off and contaminate the substrate being processed. Because these particles can seriously damage the substrates and/or prevent the proper performance of the primary process of the system, the process kit is typically replaced after a certain number of substrates have been cleaned in the system. The selected number of substrates that can be processed before a process kit replacement generally corresponds to a permissible thickness of the film formed on the surfaces of the process kit before flaking occurs. It is desirable that the process kit has a long useful lifetime, so that the downtime of the system will be a small percentage of the overall processing time. Typically, the lifetime of a process kit is specified as a particular thickness of total etched material from the substrate because it is easier to measure the amount of material cumulatively etched off of the substrate surface than to measure the non-uniform film thickness on the process kit surfaces. The lifetime of a process kit varies according to the material being etched from the substrate. For example, the lifetime of the process kit for etching $SiO_2$ typically is specified as 120 $\mu$m of total etched material from the substrates, corresponding to about 3000 substrates. However, the actual lifetime for a process kit frequently falls short of the desired or specified lifetime because materials (other than the material specified as the lifetime of the process kit) are etched during the actual etching/cleaning process, and during actual process, a process kit may last for only 20–30 $\mu$m of the cumulative etched material. These short lifetimes cause the system operator to have to service the system more often. Additionally, an unexpectedly short useful lifetime for a process kit may result in flakes of material falling onto a substrate, damaging many of the ICs formed on the substrate, while the system operator assumes that the process kit is working properly. Thus, several substrates may pass through the system before the system operator is aware that many of the devices are damaged or contaminated.

Therefore, there exists a need for an apparatus that minimizes backside sputtering of the substrate in a pre-clean chamber and other etch chambers. It would be desirable for the apparatus to reduce flaking of material from the film formed on the surfaces of the process kit. It would be further desirable for the apparatus to extend the specified lifetime of a process kit.

SUMMARY OF THE INVENTION

The invention generally provides an apparatus that minimizes backside sputtering of the substrate in a pre-clean chamber and other etch chambers. The invention also provides an apparatus that reduces flaking of material from the film formed on the surfaces of the process kit and extends the specified lifetime of a process kit. One aspect of the invention provides an apparatus for supporting a substrate, comprising a support pedestal contacting a central portion of the substrate and an insulator surrounding the support pedestal, the insulator having a beveled portion between about 10° and about 60° extending from a circumferential edge of the substrate. Preferably, a gap about 0.015 inches high is formed between an upper annular flat surface of the insulator and a lower surface of the substrate. Furthermore, the beveled portion of the insulator is treated to provide better adherence of the sputtered material from the etch/cleaning process.

Another aspect of the invention provides a substrate processing chamber comprising an etch/pre-clean chamber and a substrate support member comprising a support pedestal contacting a central portion of the substrate and an insulator surrounding the support pedestal, the insulator having a beveled portion extending from a circumferential edge of the substrate.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
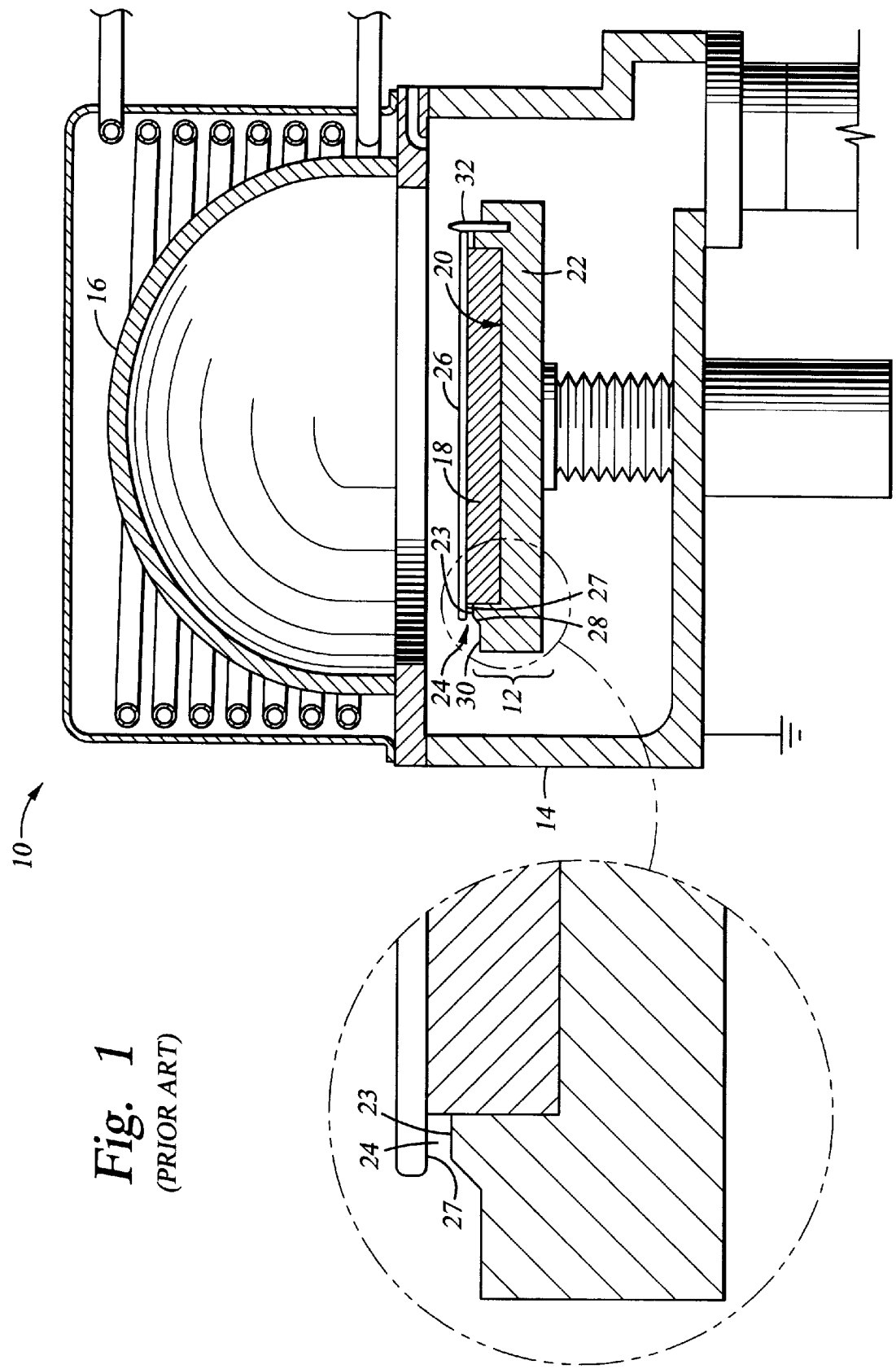
FIG. 1 is a simplified schematic view of a pre-clean chamber.
Figure 2:
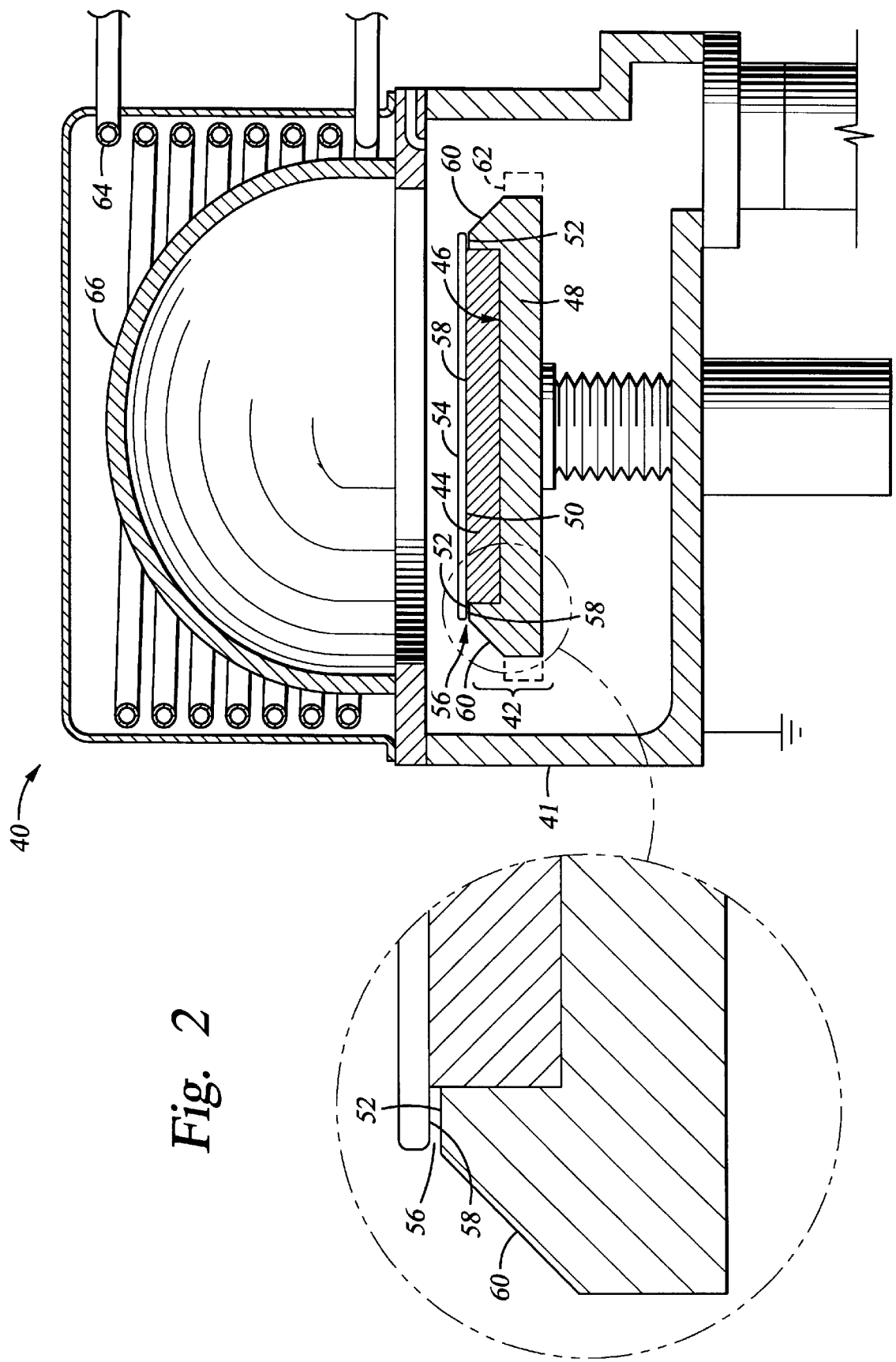
FIG. 2 is a cross sectional view of an etch/pre-clean chamber having a substrate support member according to the invention.

FIG. 2 is a cross sectional view of an etch/pre-clean chamber 40 having a substrate support member 42 according to the invention. The substrate support member 42 is disposed within the chamber enclosure 41 and generally comprises a pedestal plate 44 disposed within a recess 46 on a top surface of a quartz insulator plate 48. The top surface 50 of the pedestal plate 44 extends slightly higher than the upper annular surface 52 of the quartz insulator plate 48 and is in contact with a central portion of the bottom surface or backside 58 of the substrate 54. Preferably, the pedestal plate 44 comprises titanium and is connected to a power supply (not shown) to provide the necessary bias for etch-cleaning. The peripheral portion of the substrate 54 extends above the upper annular surface 52 of the quartz insulator plate 48 and forms a gap 56 between the bottom surface 58 of the substrate 54 and the upper annular surface 52 of the quartz insulator plate 48. Preferably, the gap 56 is reduced to about 0.015 inches (compared to 0.035 inches in prior art designs) to minimize backside sputtering. Furthermore, the outer edge of the upper annular surface 52 of the quartz insulator plate 48 has a diameter at least as great as the diameter of the outer edge of the substrate 54. The backside 58 of the substrate 54 is practically covered and only a 0.015 inch gap separates the bottom surface 58 of the substrate 54 and the upper annular surface 52 of the quartz insulator plate 48. Thus, sputtering from the backside 58 of the substrate 54 is minimized because the plasma ions are obstructed from contacting and reacting with the backside of the substrate.

A beveled portion 60 of the quartz insulator plate 48 extends from the outer edge of the upper annular surface 52 in a downward slope. Preferably, the slope of the bevel is between about 10 degrees and about 60 degrees from a horizontal plane. As shown in FIG. 2, the slope is about 45 degrees. The beveled portion 60 of the quartz insulator plate 48 minimizes deposition of the sputtered material onto the insulator plate 48 because the material sputtered from the substrate 54 does not adhere well onto the beveled portion as compared to a flat annular portion of the prior art insulator designs. It is also believed that the plasma activity is reduced on the beveled surface. Because the deposition onto the insulator plate is reduced by the invention, the process kit, including the quartz insulator plate, obtains a longer useful life. Alternatively, the quartz insulator plate 48 includes an outer annular flat surface 62 extending outwardly from the lower outer edge of the beveled portion 60. Furthermore, the exposed surface of the quartz insulator plate 48 can be finished or treated to improve adhesion of the sputtered material so that the flaking of deposited material is minimized.

The process for cleaning the substrate 54 in the pre-clean chamber 40 generally involves a sputter-etching process using the substrate 54 as the sputtering target. Generally, a cleaning gas such as argon is flowed through the chamber 40, and a plasma is struck in the chamber with a bias power applied to the substrate in the range of about 150 W to about 450 W. Additionally, a RF power is applied to the chamber through coils 64 disposed outside of the quartz dome 66. A DC bias of about −100V to about −600V, with a bias power of about 100 W to about 300 W, accelerates the ions toward the substrate 54. The pressure in the pre-clean chamber 40 during sputtering is on the order of about 0.4 mTorr to about 0.5 mTorr. Under these conditions, the pre-clean chamber 40 can typically remove about 150 Å to about 450 Å of $SiO_2$ at an etch rate of about 300 Å/min to about 600 Å/min. Typically, about 400 Å or less of oxidized material is removed from the surface of the substrates. By using a quartz insulator plate 48 according to the invention, a process kit can extend its useful life up to twice as long as previous insulator designs.

While the foregoing is directed to the preferred embodiment of the present invention, other and further embodiments of the invention may be devised without departing from the basic scope thereof. The scope of the invention is determined by the claims which follow.

What is claimed is:

1. An apparatus for supporting a substrate, comprising:
   a) a support pedestal having a central substrate supporting portion; and
   b) an insulator surrounding at least a portion of the support pedestal, the insulator having a beveled portion extending downwardly from a circumferential edge having a diameter substantially equal to a diameter of a substrate.

2. The apparatus of claim 1, wherein the support pedestal comprises titanium.

3. The apparatus of claim 1, wherein the beveled portion of the insulator is sloped downwardly at an angle of between about 10 degrees and about 60 degrees from a plane formed by the substrate supporting portion.

4. The apparatus of claim 1, wherein the beveled portion of the insulator is sloped downwardly at an angle of about 45 degrees from a plane formed by the substrate supporting portion.

5. The apparatus of claim 1, wherein a gap is formed between an upper annular flat surface of the insulator and a lower surface of a substrate.

6. The apparatus of claim 5 wherein the gap is about 0.015 inches.

7. The apparatus of claim 1, wherein the insulator has a lower annular flat surface extending from a lower edge of the beveled portion of the insulator.

8. The apparatus of claim 1 wherein the insulator comprises quartz.

9. An apparatus for processing a substrate, comprising:
a) a processing chamber; and
b) a substrate support member disposed within the processing chamber, comprising:
  i) a support pedestal having a central substrate supporting portion; and
  ii) an insulator surrounding at least a portion of the support pedestal, the insulator having a beveled portion extending downwardly from a circumferential edge having a diameter substantially equal to a diameter of a substrate.

10. The apparatus of claim 9 wherein the processing chamber is an etch chamber.

11. The apparatus of claim 9 wherein the processing chamber is a pre-clean chamber.

12. The apparatus of claim 9 wherein the support pedestal comprises titanium.

13. The apparatus of claim 9 wherein the beveled portion of the insulator is sloped downwardly at an angle of between about 10 degrees and about 60 degrees from a plane formed by the substrate supporting portion.

14. The apparatus of claim 9 wherein the beveled portion of the insulator is sloped downwardly at an angle of about 45 degrees from a plane formed by the substrate supporting portion.

15. The apparatus of claim 9 wherein a gap is formed between an upper annular flat surface of the insulator and a lower surface of the substrate.

16. The apparatus of claim 15 wherein the gap is about 0.015 inches.

17. The apparatus of claim 9 wherein the insulator has a lower annular flat surface extending from a lower edge of the beveled portion of the insulator.

18. The apparatus of claim 9 wherein the insulator comprises quartz.

* * * * *